(12) United States Patent
Azimane et al.

(10) Patent No.: US 7,392,465 B2
(45) Date of Patent: Jun. 24, 2008

(54) TESTING RAM ADDRESS DECODER FOR RESISTIVE OPEN DEFECTS

(75) Inventors: Mohamed Azimane, Eindhoven (NL); Ananta Kumar Majhi, Eindhoven (NL)

(73) Assignee: NXP B.V., Eindhoven (NL)

( * ) Notice: Subject to any disclaimer, the term of this patent is extended or adjusted under 35 U.S.C. 154(b) by 448 days.

(21) Appl. No.: 10/557,375

(22) PCT Filed: May 14, 2004

(86) PCT No.: PCT/IB2004/050696

§ 371 (c)(1),
(2), (4) Date: Nov. 18, 2005

(87) PCT Pub. No.: WO2004/105043

PCT Pub. Date: Dec. 2, 2004

(65) Prior Publication Data

US 2007/0067706 A1     Mar. 22, 2007

(30) Foreign Application Priority Data

May 22, 2003   (EP) ................................. 03101471

(51) Int. Cl.
*H04L 7/00* (2006.01)
(52) U.S. Cl. .................... 714/814; 714/815; 714/823
(58) Field of Classification Search ............... 714/726, 714/738, 741, 814, 815, 823; 716/4
See application file for complete search history.

(56) References Cited

U.S. PATENT DOCUMENTS 5,642,362 A * 6/1997 Savir .......................... 714/726
6,345,373 B1 * 2/2002 Chakradhar et al. ........ 714/738
6,453,437 B1 * 9/2002 Kapur et al. ................ 714/741
6,651,227 B2 * 11/2003 Abadir et al. .................. 716/4
7,039,845 B2 * 5/2006 Rearick et al. ............. 714/738

FOREIGN PATENT DOCUMENTS

EP       0738418 B1    1/2002

* cited by examiner

*Primary Examiner*—David Ton
(74) *Attorney, Agent, or Firm*—Peter Zawilski

(57) ABSTRACT

Hard-open defects between logic gates of, for example, an address decoder and the voltage supply which result in logical and sequential delay behavior render a memory conditionally inoperative. A method and apparatus for testing integrated circuits for these types of faults is proposed, in which two cells of two logically adjacent rows or columns are written with complementary logic data. If a read operation reveals the data in the two cells to be identical, the presence and location of a hard-open defect is demonstrated. The read and write operations each occur as a result of a clock pulse, and the method includes the steps of setting a clock cycle such that, in the event that said first cell is demonstrating slow-to-fall behavior, the reading cycle will be caused to be performed before the logic state of said first cell has fallen to its minimum level, and/or setting the width of said clock pulses such that, in the event that the first cell is demonstrating slow-to-rise behavior, the reading cycle will be caused to be performed before the logic state of said first cell has risen to its maximum level.

7 Claims, 5 Drawing Sheets

Slow-to-fall behaviour

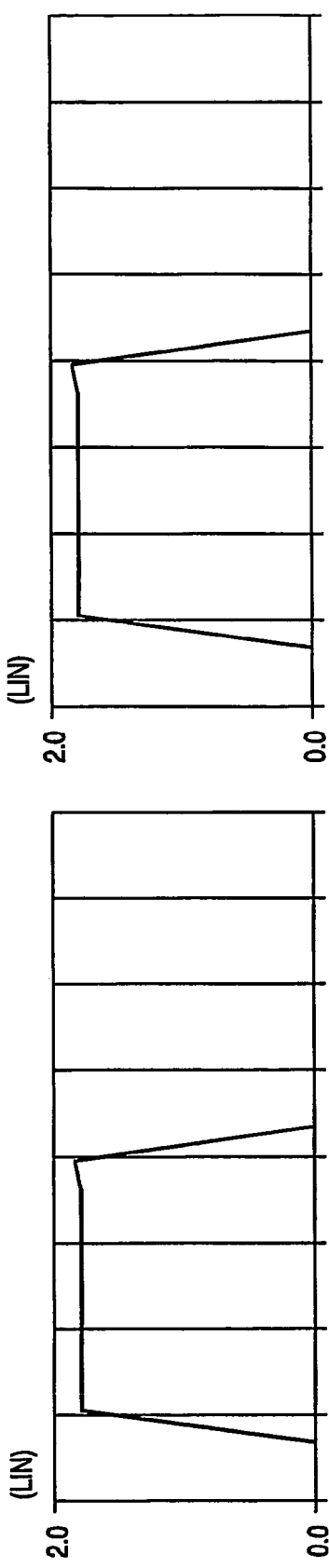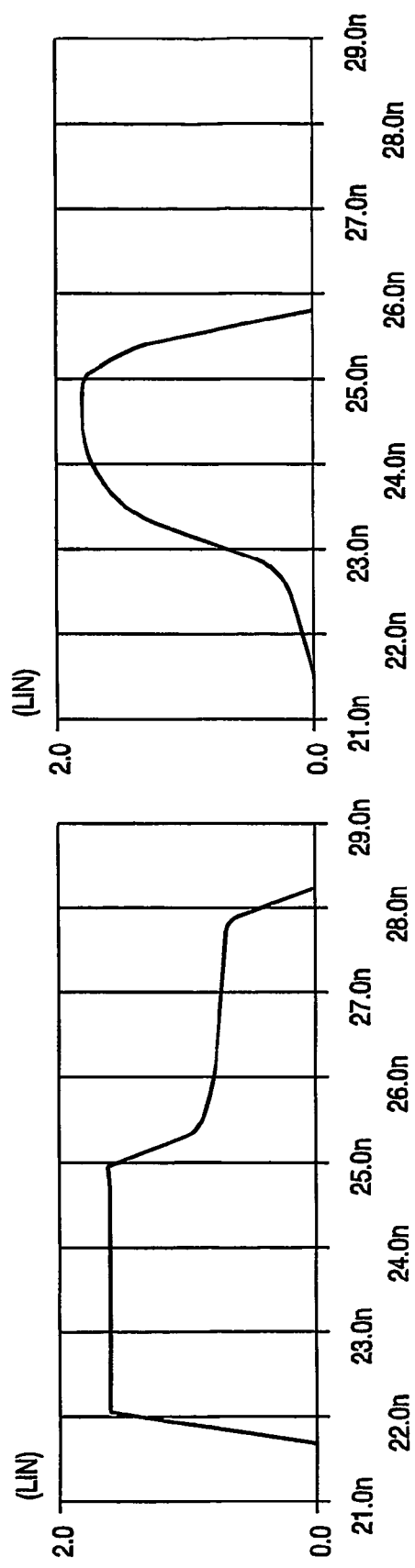
FIG. 2a
Slow-to-fall behaviour
FIG. 2b
Slow-to-rise behaviour Slow-to-fall undetected Slow-to-fall detected Slow-to-rise undetected Slow-to-rise detected

TESTING RAM ADDRESS DECODER FOR RESISTIVE OPEN DEFECTS

This invention relates to a method and apparatus for testing an integrated circuit, such as a semiconductor memory address decoder or a random logic circuit, and more particularly, to a method and apparatus for testing such circuits in the presence of open defects.

Systematic and automatic testing of electronic circuitry, and of integrated circuits in particular, is becoming increasingly important. Each generation of circuit tends to comprise ever higher component densities and an increasing number of system functionalities. Individual circuits have become complicated to such an extent that process defects cannot be detected and located, except by means of exhaustive and expensive testing. It will be appreciated that customers cannot be expected to accept circuitry products that only reveal their hidden defects during operational use, thereby rendering, for example, life support systems or aircraft control systems unreliable. It is therefore of the utmost importance to both the manufacturer and the customer that tests are performed so as to ensure flawless operation of the circuitry products.

Random access memories (SRAMs, DRAMs) occupy a strategic position in the microelectronics industry. In many respects, RAM testing is different from conventional logic testing. RAMs tend to be the largest and densest circuits produced, and their small feature size and huge chip size result in an enormous critical area for defects. High complexity and defect sensitivity have pushed RAM testing costs to the extreme, and a variety of solutions to this problem have been proposed.

Random access memories are usually subjected to March tests. In a March test, individual march elements traverse all RAM addresses and perform a specified combination of read and write operations. For example, a typical march element first reads each RAM address location and then writes back the complement of expected data values. Together, all of the march elements should cover all of the likely faults in a given RAM.

After compiling the likely faults into a RAM fault model, a test engineer will develop a test algorithm to cover it. The total number of memory operations performed by all march elements for a given RAM address determines a test algorithm's overall complexity. The complexity of march test algorithms is linear with respect to the address space; hence, they are also known as linear algorithms.

Conventionally, it has been suggested that RAM decoder defects can be mapped as RAM array faults and detected by testing the RAM array, such that in the past it has been assumed that circuits such as address decoders need no special testing. However, it has since been discovered that some open defects can occur in circuits such as RAM address decoders which are not detectable by means of march tests.

Open defects, or stuck-open transistor faults, cause sequential behavior in CMOS circuits and require a two-pattern test sequence for their detection. Open defects in RAM matrices appear as cell read failures, row/column read failures, or cell stuck-at (SA) faults, all of which are detectable by march tests. However, march tests fail to detect one class of open defects in circuits such as address decoders.

Generally, a missing contact, thinner metal, larger numbers of vias, poly breaks, the scaling of the devices and the increase in complexity of the fabrication process all result in an increased number of open defects in CMOS technology. The probability of the occurrence of open defects is further increasing with the move from aluminium to copper in lower technology (from CMOS12 and below).

Referring to FIG. 1 of the drawings, open defects can be classified into two classes, as follows:

Inter-gate defects, which occur between different gates of an address decoder and tend to cause stuck-at or logical delay behavior; the stuck-at behavior can normally be detected by the conventional march tests; however, logical delay behavior cannot.

Intra-gate defects, which occur within the different gates of an address decoder and tend to cause sequential or sequential delay behavior; these types of defects are not completely covered by traditional march tests, and hence require special multiple test pattern sequences.

A method of testing a memory address decoder is disclosed in European Patent Number EP-B-0738418. The method disclosed in this document involves writing complementary logic data to two respective cells of two logically adjacent rows or columns. If a subsequent Read operation reveals the data in the two cells to be identical, the presence and location of a hard-open defects in the decoders is demonstrated. In more detail, the method disclosed in EP-B-0738418 uses a systematic approach in which a first logic state is written to the first cell and then a second logic state, complementary to the first, is written to the second cell. Reading the first cell after completion of the write operation of the Write operation conducted on the second cell should reveal that the first cell is still in the first logic state if the decoding means is functioning correctly. However, if the first cell turns out to have assumed the second logic state, then the first cell was overwritten during the Write operation of the second cell, thereby enabling the detection and location of a defect in the decoding means.

The test method described in EP-B-0738418 can be used to detect resistive open defects which lead to sequential behavior. However, the class of resistive open defect which leads to sequential delay behavior is not covered, as will be explained in more detail below.

Thus, the march tests do not cover the intra-gate resistive open defects because this family of algorithms is based on generating the addresses in an increasing and decreasing address order. Also, it is impossible to cover exhaustively such open defects by linear algorithms. The intra-gate open defects require the use of special test pattern sequences which have to be added to the march tests to increase the open defect coverage. Moreover, resistive open defects which lead to logical and sequential delay behavior remain completely uncovered.

Referring to FIGS. 2a and 2b, logical and sequential delay behavior can be categorized by "slow-to-fall" behavior (FIG. 2a), in which the logic state of the cell gradually falls from its maximum over time, and "slow-to-rise" behavior (FIG. 2b), in which the maximum logic state is gradually reached over time.

These types of defect lead to significant customer returns and reliability problems. Accordingly, we have devised an improved arrangement.

In accordance with a first aspect of the present invention, there is provided a method for testing an electronic circuit that comprises a plurality of cells for receiving logic data, the method comprising a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the method being characterized by the step of setting a clock cycle such that, in the event that the first cell is demonstrating slow-to-fall behavior, the reading cycle will be caused to be performed before the logic state of said first cell has fallen to its minimum level.

Also in accordance with the first aspect of the present invention, there is provided apparatus for testing an electronic circuit that comprises a plurality of cells for receiving logic data, the apparatus comprising means for performing consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the apparatus being characterized by means for setting a clock cycle such that, in the event that the first cell is demonstrating slow-to-fall behavior, the reading cycle will be caused to be performed before the logic state of said first cell has fallen to its minimum level.

In accordance with a second aspect of the present invention, there is provided a method for testing an electronic circuit that comprises a plurality of cells for receiving logic data, the method comprising a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the method being characterized by the step of setting the width of said clock pulses such that, in the event that the first cell is demonstrating slow-to-rise behavior, the reading cycle will be caused to be performed before the logic state of said first cell has risen to its maximum level.

Also in accordance with the second aspect of the present invention, there is provided apparatus for testing an electronic circuit that comprises a plurality of cells for receiving logic data, the apparatus comprising means for performing a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the apparatus being characterized by means for setting the width of said clock pulses such that, in the event that the first cell is demonstrating slow-to-rise behavior, the reading cycle will be caused to be performed before the logic state of said first cell has risen to its maximum level.

Still further in accordance with the present invention, there is provided a method for testing an electronic circuit that comprises a plurality of cells for receiving logic data, the method comprising a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the method being characterized by the steps of setting a clock cycle such that, in the event that said first cell is demonstrating slow-to-fall behavior, the reading cycle will be caused to be performed before the logic state of said first cell has fallen to its minimum level, and of setting the width of said clock pulses such that, in the event that the first cell is demonstrating slow-to-rise behavior, the reading cycle will be caused to be performed before the logic state of said first cell has risen to its maximum level.

In one embodiment of the invention, the plurality of cells may be arranged in a plurality of rows and a plurality of columns, and the electronic circuit may comprise input means operative to receive an address and decoding means between the input means and the plurality of cells and being operative to enable addressing of the cells on the basis of the addresses, the decoding means comprising a plurality of row decoders, wherein the method enables testing first and second ones of the row decoders by having the first address and the second address represent respective ones of the rows.

In an alternative exemplary embodiment, the plurality of cells may be arranged in a plurality of rows and a plurality of columns, and the electronic circuit may comprise input means operative to receive an address and decoding means between the input means and the plurality of cells and being operative to enable addressing of the cells on the basis of the addresses, the decoding means comprising a plurality of column decoders, wherein the method enables testing first and second ones of the column decoders by having the first address and the second address represent respective ones of the columns. These and other aspects of the present invention will be apparent from, and elucidated with reference to, the embodiments described hereinafter.

Embodiments of the present invention will now be described by way of examples only, and with reference to the accompanying drawings, in which:

FIG. 2a is a graphical illustration of the correct behavior (top) and slow-to-fall behavior (bottom) which may be displayed by a cell;

FIG. 2b is a graphical illustration of the correct behavior (top) and slow-to-rise behavior (bottom) which may be displayed by a cell;

Figure 4A:
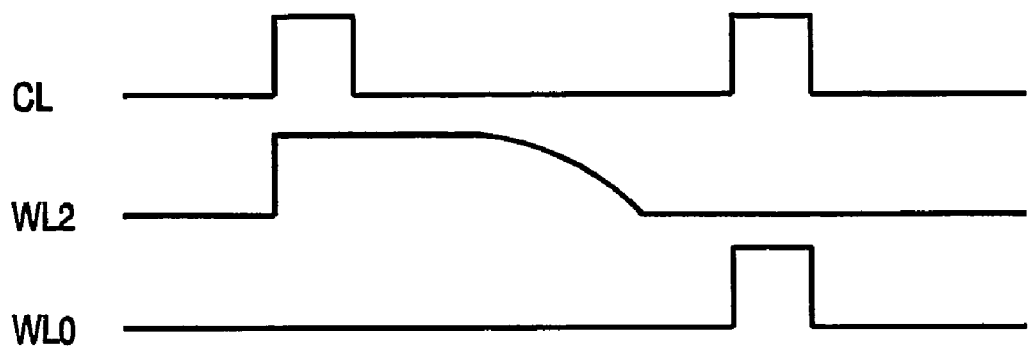
Figure 5A:
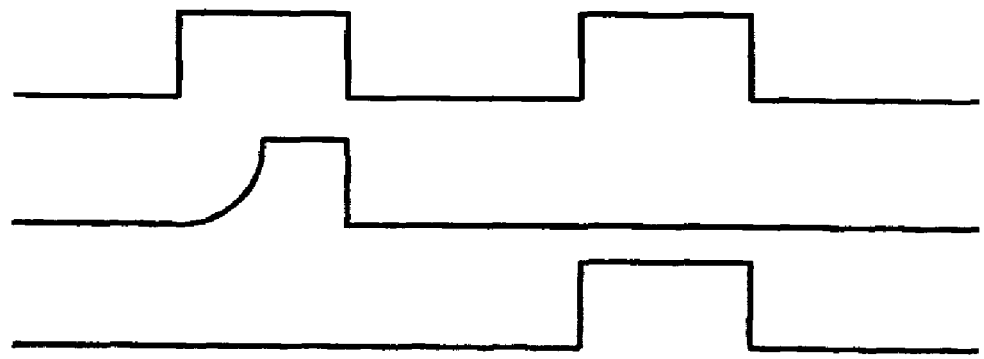

FIGS. 4(a) and (b) are schematic graphical illustrations of the slow-to-fall behavior and detection result in accordance with the prior art and an exemplary embodiment of the present invention respectively; and FIGS. 5(a) and (b) are schematic graphical illustrations of the slow-to-rise behavior and detection result in accordance with the prior art and an exemplary embodiment of the present invention respectively.

Figure 1:
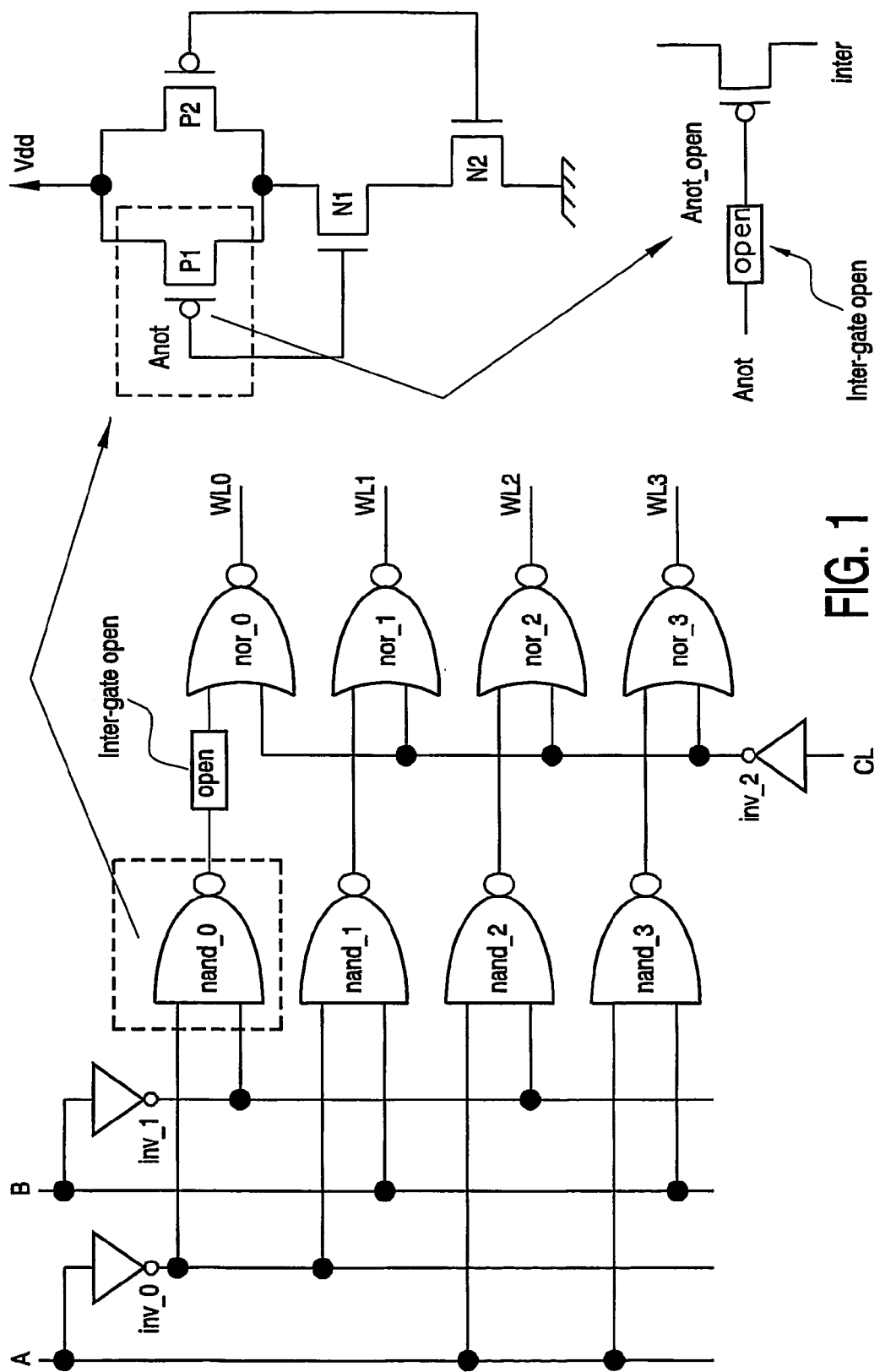
FIG. 1 is a schematic circuit diagram of a conventional address decoder illustrating inter-gate and intra-gate open defects.
Figure 3:
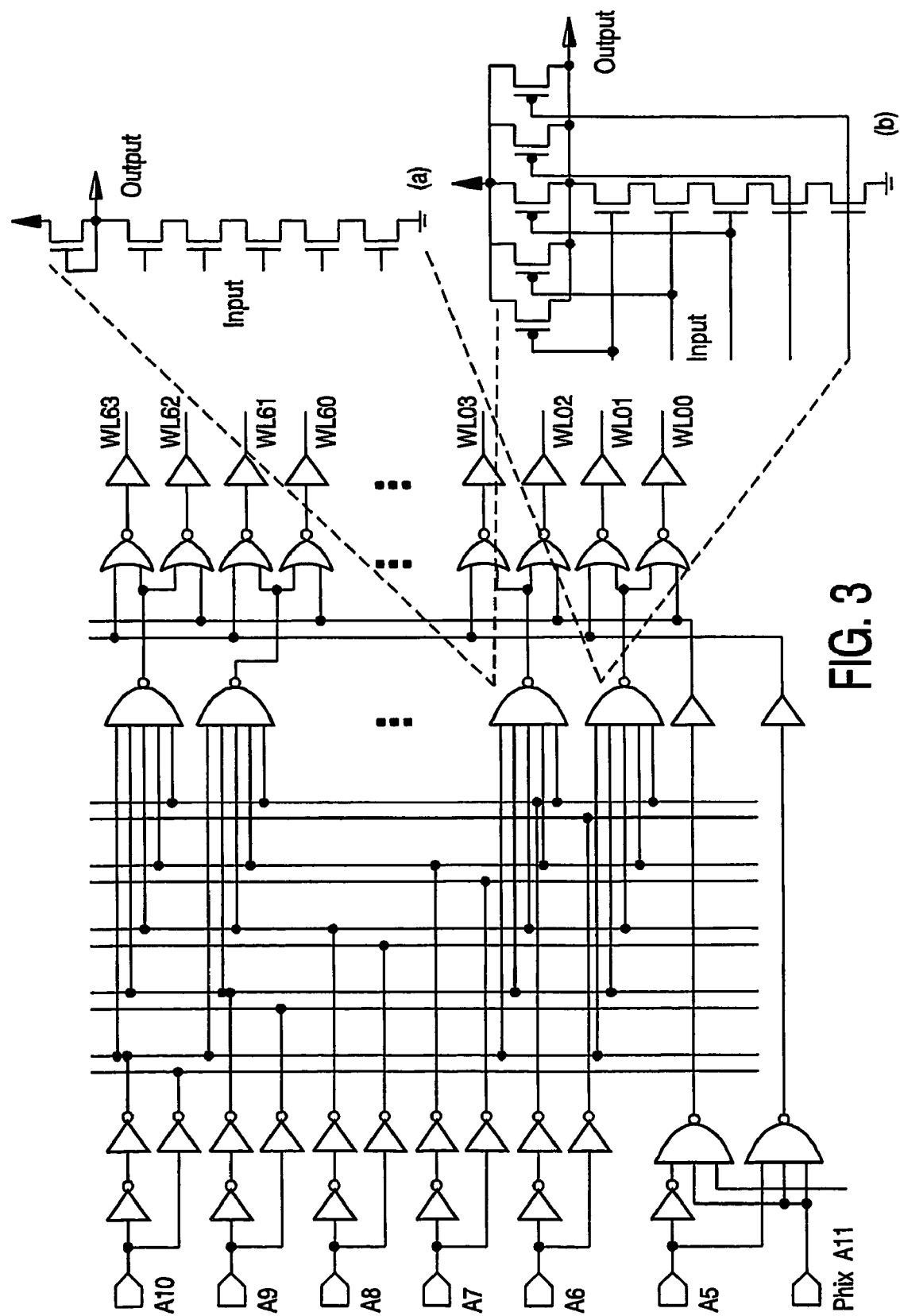
FIG. 3 is a schematic circuit diagram of a typical address decoder with NMOS (a) and CMOS (b) five-input NAND gate implementations, wherein 'Phix' is the timing (or clock) signal, 'A' denotes an address bit, and 'WL' denotes a word line.

Referring to FIG. 3 of the drawings, there is illustrated a typical address decoder with NMOS and CMOS logic implementations. An NMOS gate uses a depletion-mode NMOS load transistor and switching enhancement-mode transistors. In contrast, a fully static CMOS logic gate consists of an equal number of enhancement-mode PMOS and NMOS transistors.

An address decoder selects a word line according to the input address. This requires logic gate outputs in the address decoder to be active only for a unique input address and inactive for the rest. For example, for the NAND gates in FIG. 3, the output is active (logic 0) only if all the gate's inputs are high, and inactive (logic 1) in the rest of the cases.

In NMOS technology, the depletion-mode load transistor pulls up the output to the inactive state when inputs are not activating the gate. An open defect in an NMOS logic gate's switching transistor causes the gate to remain inactive when it should be active. In other words such a defect prevents the address decoder from accessing the addressed cell. On the other hand, if there is an open defect in the load transistor, the logic gate remains active, resulting in a multiple-access fault.

A CMOS logic gate in the address decoder arrives at the active state in the same manner. However, it reaches the inactive state by several parallel paths (depending on the fan-in) selected by the input addresses. Open defects in these parallel paths to activation are a particular problem.

As explained above, the conventional march tests do not effectively detect all open resistive defects. Thus, an additional testing loop can be added to the march tests, as described in EP-B-0738418 and explained in more detail below. Assume that m is the number of input bits of a word line decoder, and the number of word lines is $2^m$. In order to test the row-decoding logic, any arbitrary column address can be selected for read and write operations. To test for the hard-to-detect opens, each NAND gate in the decoding logic is tested sequentially. For each NAND gate, the corresponding word line writes a logic 0 to a selected cell. The word line address is then changed such that only one address bit changes. This allows a particular p-channel transistor in the NAND gate to disable the NAND gate, and a logic 1 is then written to the new address location. If the p-channel transistor has an open defect, the first cell is still enabled and the write operation to the second cell can also overwrite the content of the first cell. A subsequent read operation in respect of the first cell will detect a read failure, and hence the open defect, accordingly. This procedure is repeated for all address bits to NAND gates and for all NAND gates.

However, as explained above, even this additional testing does not necessarily detect open resistive defects which may cause a word line to demonstrate slow-to-fall or slow-to-rise behavior. As illustrated in FIG. 4(a), word line WL2 is behaving as slow-to-fall. Thus, in response to clock cycle 1, a logic 0 is written to WL2 and, in response to subsequent clock cycle 2, a logic 1 is written to word line WL0. Even though word line WL2 is behaving as slow-to-fall the read operation performed after the write operation in respect of WL0 is correctly performed, because the time between the two clock cycles is sufficient to allow the logic value of WL2 to fall to 0. However, according to the first aspect of the invention, the clock period is reduced to say around half (see FIG. 4(b)), when clock cycle 2 occurs and the write operation in respect of WL0 is performed, WL2 is still enabled when the write operation in respect of WL0 commences, which leads to simultaneous access to two memory positions, a situation which is relatively easily detected.

Figure 5B:
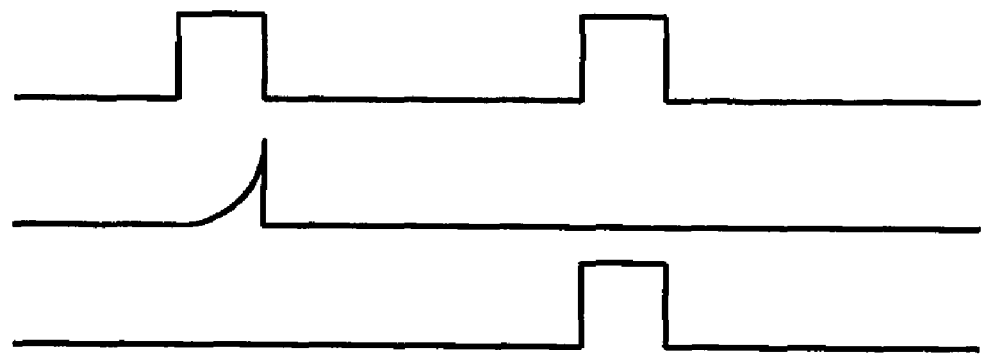

Referring to FIG. 5(a) of the drawings, WL2 is displaying slow-to-rise behavior. In response to clock cycle 1, a logic 1 is written to WL2, the logic state of which slowly rises to its maximum value during the pulse width of clock cycle 1. By the time clock cycle 1 is complete, the logic state of WL2 has risen to its maximum value and remains there for a long time, such that the slow-to-rise behavior goes undetected. If, however, according to the second aspect of the invention, the pulse width of the clock cycle is reduced to, say, around half (see FIG. 5(b)), then the time provided for the WL2 write operation is insufficient to allow the slow-to-rise logic state of WL2 to rise, which leads to stuck-at 0 or 1 at the memory outputs (depending on the memory design), which are easily detected.

Generally, the duty cycle is 50% of the clock cycle.

To detect the slow-to-rise resistive open defects, it is preferred that the duty cycle is between 25% and 50% of the clock period, which means that the pulse width becomes smaller to facilitate slow-to-rise detection. As the duty cycle is decreased from 50% to 25%, the fault coverage for slow-to-rise delay fault types is increased.

Figure 4B:
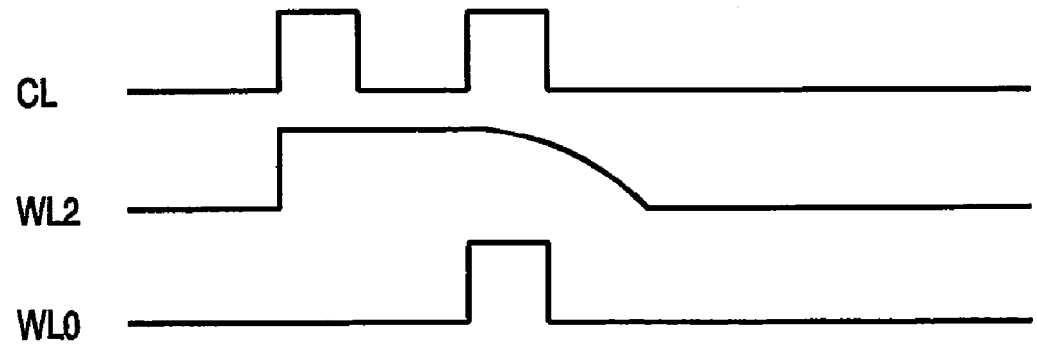

To detect slow-to-fall resistive open defects, it is preferred that the duty cycle is between 50% and 75% of the clock period, which means that the pulse width becomes larger (although this is not specifically illustrated in FIG. 4(b)) to facilitate slow-to-fall detection. As the duty cycle is increased from 50% to 75%, the fault coverage for slow-to-fall delay fault types is increased.

Thus, the present invention involves setting the clock configuration of the testing circuitry in order to increase the resistive open defect coverage. The solution consists of a reduction in the clock period (relative to conventional methods) to cover the class of defects which cause slow-to-fall behavior, and the reduction of the pulse width (again, relative to conventional methods) to cover the class of defects which behave as slow-to-rise. The present invention increases the detection of resistive open defects and therefore significantly decreases customer returns. In the present invention, in contrast to conventional methods, defect coverage in respect of resistive open defects depends not only on the test patterns, but also on the clock configuration. It will be appreciated that, although an exemplary embodiment of the present invention has been described above in relation to a memory address decoder, the proposed method and apparatus could be used for testing many different types of electronic circuitry for open resistive defects, including, for example, random logic circuits.

An embodiment of the present invention has been described above by way of example only, and it will be appreciated by a person skilled in the art that modifications and variations can be made to the described embodiment without departing from the scope of the invention as defined by the appended claims. Furthermore, it will be appreciated that the term "comprising" used herein does not exclude other elements or steps, "a" or "an" does not exclude a plurality, and a single processor or other unit may fulfill the functions of several means recited in the claims.

The invention claimed is:

1. A method for testing an electronic circuit that comprises a plurality of cells for receiving logic data, the method comprising a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse;

the method being characterized by the step of setting a clock cycle such that, in the event that said first cell is demonstrating slow-to-fall behavior, the reading cycle will be caused to be performed before the logic state of said first cell has fallen to its minimum level.

2. A method for testing an electronic circuit that comprises a plurality of cells for receiving logic data, the method comprising a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse;

the method being characterized by the step of setting the width of said clock pulses such that, in the event that the first cell is demonstrating slow-to-rise behavior, the reading cycle will be caused to be performed before the logic state of said first cell has risen to its maximum level.

3. A method for testing an electronic circuit that comprises a plurality of cells for receiving logic data, the method comprising a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the method being characterized by the steps of setting a clock cycle such that, in the event that said first cell is demonstrating slow-to-fall behavior, the reading cycle will be caused to be performed before the logic state of said first cell has fallen to its minimum level, and of setting the width of said clock pulses such that, in the event that the first cell is demonstrating slow-to-rise behavior, the reading cycle will be caused to be performed before the logic ,state of said first cell has risen to its maximum level.

4. The method of claim 1, wherein the plurality of cells are arranged in a plurality of rows and a plurality of columns, and the electronic circuit comprises input means operative to receive an address and decoding means between the input means and the plurality of cells and being operative to enable addressing of the cells on the basis of the addresses, the decoding means comprising a plurality of row decoders, and further wherein the method enables testing first and second ones of the row decoders by having the first address and the second address represent respective ones of the rows.

5. The method of claim 1, wherein the plurality of cells are arranged in a plurality of rows and a plurality of columns, and the electronic circuit comprises input means operative to receive an address and decoding means between the input means and the plurality of cells and being operative to enable addressing of the cells on the basis of the addresses, the decoding means comprising a plurality of column decoders, and further wherein the method enables testing first and second ones of the column decoders by having the first address and the second address represent respective ones of the columns.

6. Apparatus for testing an electronic circuit that comprises a plurality of cells for receiving logic data, the apparatus comprising means for performing consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the apparatus being characterized by means for setting a clock cycle such that, in the event that the first cell is demonstrating slow-to-fall behavior, the reading cycle will be caused to be performed before the logic state of said first cell has fallen to its minimum level.

7. Apparatus for testing an electronic circuit that comprises a plurality of cells for receiving logic data, the apparatus comprising means for performing a series of consecutive stages that each comprise a sequence of cycles, as follows:

writing a first logic state into a first cell of said plurality of cells;

writing a second logic state, complementary to said first logic state, into a second cell which is logically adjacent to said first cell; and reading said first cell after said second logic state has been written into said second cell;

wherein each of said cycles occurs as a result of a clock pulse; the apparatus being characterized by means for setting the width of said clock pulses such that, in the event that the first cell is demonstrating slow-to-rise behavior, the reading cycle will be caused to be performed before the logic state of said first cell has risen to its maximum level.

* * * * *